United States Patent [19]
Nakata

[11] 4,131,816
[45] Dec. 26, 1978

[54] MECHANISM AND METHOD FOR SUPPORTING A TUNING FORK-TYPE QUARTZ CRYSTAL ELEMENT

[75] Inventor: Hozumi Nakata, Iruma, Japan

[73] Assignee: Nihon Dempa Kogyo Co., Ltd., Tokyo, Japan

[21] Appl. No.: 729,179

[22] Filed: Oct. 4, 1976

Related U.S. Application Data

[63] Continuation of Ser. No. 534,146, Dec. 18, 1974, abandoned.

[30] Foreign Application Priority Data

Dec. 22, 1973 [JP] Japan .................................. 48-3032
Aug. 30, 1974 [JP] Japan ................................ 49-103980

[51] Int. Cl.² ........................................... H01L 41/10
[52] U.S. Cl. ................................................ 310/348
[58] Field of Search .................. 310/8.2, 8.5, 8.6, 9.5, 310/9.6, 9.1, 9.4, 370, 348; 84/457; 58/23 TF; 29/25.35

[56] References Cited

U.S. PATENT DOCUMENTS

| | | | |
|---|---|---|---|
| 2,195,417 | 4/1940 | Mason | 310/370 X |
| 3,354,413 | 11/1967 | Ko | 310/9.1 UX |
| 3,805,509 | 4/1974 | Assmus et al. | 310/9.1 X |
| 4,035,673 | 7/1977 | Ishida et al. | 310/370 X |

*Primary Examiner*—Mark O. Budd
*Attorney, Agent, or Firm*—Flynn & Frishauf

[57] ABSTRACT

A mechanism and method for supporting a tuning fork-type quartz crystal element which is arranged to fix the common connecting section of a pair of arms of the subject quartz crystal element having a substantially U-shape directly to a base member supporting the element by a particular adhesive agent having an acoustic impedance different from that of the quartz crystal element, thereby preventing a mechanical vibration energy from being transmitted during vibration of the quartz crystal element to the base member and supporting the quartz crystal element with the greatest possible stability and strength on the base member against external mechanical vibrations and shocks.

15 Claims, 18 Drawing Figures

MECHANISM AND METHOD FOR SUPPORTING A TUNING FORK-TYPE QUARTZ CRYSTAL ELEMENT

This is a continuation, of application Ser. No 534,146, filed Dec. 18, 1974 now abandoned.

This invention relates to an improved mechanism and method for supporting a tuning fork-type quartz crystal element particularly designed mechanically to vibrate within a low frequency range from about 1 KHz to about 1 MHz. A tuning fork-type quartz crystal vibrating at such a low frequency is exemplified by one designed to vibrate at 32.768 KHz for a quartz crystal electric watch.

The prior art systems for supporting such a tuning fork-type quartz crystal element include a type constructed as shown in FIG. 1. A base member 11 is provided on which a pair of rod electrodes 12a and 12b concurrently serving as external electrodes are mounted at a predetermined interval in such a manner that the respective rod electrodes 12a and 12b extend upward and downward of the base member 11. A substantially U-shaped tuning fork-type quartz crystal element 13 of the undermentioned configuration is disposed at a prescribed position above the base member 11 between the pair of rod electrodes 12a and 12b as shown in FIG. 1. The quartz crystal element 13 comprises a pair of arms 13a and 13b formed with almost the same dimensions, i.e., cross section and length, and a common connecting section 13c jointly connecting the corresponding ends of the pair of arms 13a and 13b. Under this arrangement, the quartz crystal element 13 is fitted by a pair of flexible lead wires 15a and 15b made of, e.g., phosphor bronze to the pair of rod electrodes 12a and 12b, by soldering a pair of nodal points 14a and 14b on a pair of crystal electrodes previously evaporated on the surface of the quartz crystal element 13 to the corresponding rod electrodes 12a and 12b by the respective lead wires 15a and 15b.

However, such a supporting system as shown in FIG. 1 has the disadvantage that the quartz crystal element 13 is supported in so unstable a state that the crystal element 13 is only fitted by means of the paired lead wires 15a and 15b to the rod electrodes 12a and 12b. Consequently, part of a mechanical vibration energy provided by the pair of arms 13a and 13b of the crystal element 13 tends to be transmitted through the pair of lead wires to the rod electrodes 12a and 12b as well as to the base member 11. Additionally, the crystal element 13 tends to be affected not only by external mechanical vibrations and shocks but also by free vibration frequency of the paired lead wires 15a and 15b. As a result, it should be pointed out that the electric properties of the subject quartz crystal element such as vibration frequency and effective resistance would prominently vary between before and after attachment of the quartz crystal element to the pair of rod electrodes as well as during long use of the same.

Accordingly, there has been recently proposed a supporting system for a tuning fork-type quartz crystal element as shown in FIG. 2 which is intended to improve the supporting system of FIG. 1.

The supporting system of FIG. 2 is almost equivalent to that of FIG. 1, excepting that substantially the center of the bottom of the aforesaid common connecting section 13c of the quartz crystal element 13 is further attached to the base member 11 by a fine supporting rod 16 made of appropriate elastic material such as gold or copper.

Therefore, parts of FIG. 2 corresponding to those of FIG. 1 are designated by the same symbols and the description thereof is omitted.

The tuning fork-type quartz crystal element 13 of the aforementioned construction is generally designed mechanically to vibrate in the so-called tuning fork-type mode in which the pair of arms 13a and 13b of the crystal element 13 bend in reverse directions to substantially the same degree. Accordingly, for an ideal tuning fork-type quartz crystal element in which a pair of arms thereof are designed to have the same dimensions, a mechanical vibration energy developed during the aforesaid flexural or bending vibration of the crystal element 13 should not be transmitted to the center of the bottom of the aforementioned common connecting section 13c of the crystal element 13. Consequently, the supporting system of FIG. 2 can support the crystal element 13 in a more stable state than that of FIG. 1, keeping the above-mentioned electric properties of the crystal element 13 almost unchanged between before and after attachment of the crystal element 13 to the base member 11 as well as during long use of the same.

However, actually manufactured tuning fork-type quartz crystal elements of the above-mentioned construction each generally have a pair of arms bearing different dimensions, causing part of a mechanical vibration energy developed by the paired arms of the quartz crystal element to be transmitted to the common connecting section of the paired crystal arms. Therefore, the supporting system of FIG. 2 still has the disadvantages that:

(a) the electric properties of the subject quartz crystal element 13 such as vibration frequency and effective resistance still somewhat vary between before and after attachment of the crystal element 13 to the base member 11, because the mechanical vibration energy present at the common connecting section 13c of the paired crystal arms 13a and 13b is, as naturally expected, transmitted through the supporting rod 16 to the base member 11;

(b) since the supporting rod 16 is fitted to substantially the center of the common connecting section 13c of the paired crystal arms 13a and 13b in a manner of point contact, the process of attaching the supporting rod 16 to the crystal element 13 requires high degree of technique and perception, and in addition different attached positions will give rise to deviations in the electric properties of the respective crystal elements; and (c) the supporting rod 16 tends to remain deformed for a long period of time, resulting in variations in the electric properties of the crystal element 13 during long use.

It is therefore the object of this invention to provide a mechanism and method for supporting a tuning fork-type quartz crystal element which is capable of keeping the electric properties of the subject quartz crystal element with the highest possible precision and stability between before and after attachment of the crystal element to a holding means supporting the same as well as during long use thereof, said mechanism admitting of miniaturization.

SUMMARY OF THE INVENTION

A mechanism and method according to this invention for supporting a tuning fork-type quartz crystal element is characterized by fixing the common connecting section of a pair of arms of the subject quartz crystal element having a substantially U-shape directly to a holding means supporting the crystal element by a particular adhesive agent having an acoustic impedance different from that of the crystal element.

Even if part of a mechanical vibration energy developed by the paired arms of the crystal element is transmitted to the common connecting section of the paired crystal arms, then such a mechanism and method for supporting a tuning fork-type quartz crystal element would enable a large amount of the transmitted vibration energy to be absorbed or suppressed by the layer of the adhesive agent so as to be scarcely transferred to said holding means, and in addition allow the crystal element to be fitted to the holding means in a more stable and firmer state than in the prior art without requiring any particular technique, thereby maintaining the electric properties of the crystal element with the highest possible accuracy and stability between before and after attachment of the crystal element to the holding means as well as during long use.

BRIEF DESCRIPTION OF THE DRAWINGS

This invention can be more fully understood from the following detailed description when taken in conjunction with the accompanying drawings, in which.

DETAILED DESCRIPTION OF THE DRAWINGS

Mechanisms and methods according to the preferred embodiments of this invention for supporting a tuning fork-type quartz crystal element will now be described with reference to FIGS. 4 to 11.

Figure 4A:
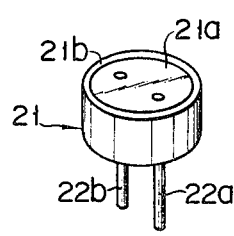
FIGS. 4A and 4B jointly are a schematic perspective view of a mechanism and method for supporting a tuning fork-type quartz crystal element embodying this invention.
Figure 4B:
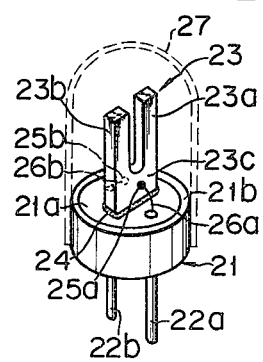

FIGS. 4A and 4B jointly are a schematic perspective view according to one embodiment of this invention.

A base member 21 is made of electric insulating material such as glass and has the hereinafter described dimensions.

Embedded in the base member 21 are a pair of external electrodes 22a and 22b at a prescribed interval such that each embedded end of the respective external electrodes 22a and 22b is exposed on the upper surface of the base member 21. A tuning fork-type quartz crystal element 23 having a substantially U-shape as later described is fixed to the base member 21 in the undermentioned manner.

The quartz crystal element 23 comprises a pair of arms 23a and 23b formed with substantially the same dimensions, i.e., cross section and length, and a common connecting section 23c connecting the corresponding ends of the paired crystal arms 23a and 23b. Thus, the bottom of the aforesaid common connecting section 23c of the crystal element 23 is bonded to the base member 21 by the hereinafter described particular adhesive agent 24 having an acoustic impedance different from that of the crystal element 23. Under this arrangement, a pair of nodal points 25a and 25b on a pair of crystal electrodes previously evaporated on the surface of the crystal element 23 are soldered to the respective embedded ends of the paired external electrodes 22a and 22b by a pair of flexible lead wires 26a and 26b made of e.g., phosphor bronze and having a predetermined length.

Figure 1:
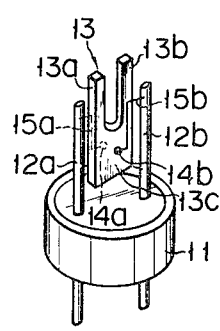
FIG. 1 is a schematic perspective view of a prior art holding system for supporting a tuning fork-type quartz crystal element.
Figure 2:
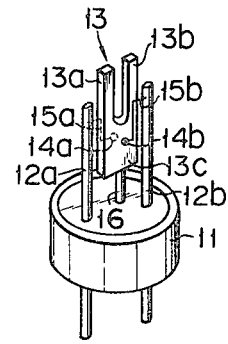
FIG. 2 is a schematic perspective view of another prior art holding system for supporting a tuning fork-type quartz crystal element.
Figure 3:
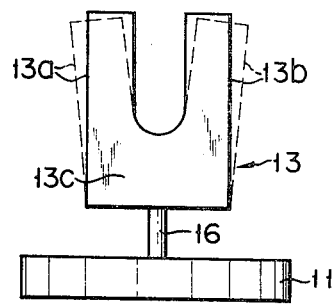
FIG. 3 is an enlarged front view illustrating the vibrational behavior of the crystal element of FIG. 2.
Figure 5:
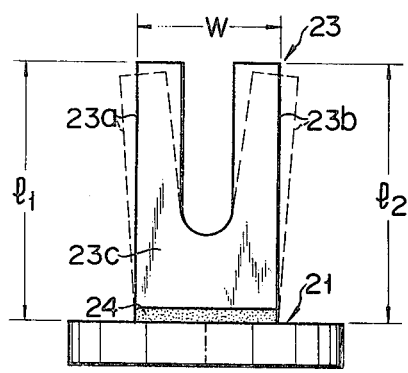
FIG. 5 is an enlarged front view illustrating the vibrational behavior of the crystal element of FIG. 4B.

Even if part of a mechanical vibration energy is transmitted to the common connecting section 23c of the paired crystal arms 23a and 23b when the paired arms 23a and 23b of the crystal element 23 vibrate, as shown in FIG. 5 in phantom, in reverse directions to substantially the same degree, then the holding system of FIGS. 4A and 4B for supporting the crystal element 23 will enable the transmitted vibration energy to be absorbed or suppressed by the layer of the adhesive agent 24 having a different acoustic impedance from that of the crystal element 23 so as to be scarcely transferred to the base member 21 and in addition allow the subject crystal element 23 to be fitted to the base member 21 in a more stable and firmer state than in the holding system of FIG. 2 without any particular technique as in utilization of the supporting rod 16 of FIG. 2.

As a result, the holding system of FIGS. 4A and 4B for the crystal element 23 has the advantage that the electric properties of the crystal element 23 including vibration frequency and effective impedance are maintained with the highest possible accuracy and stability between before and after attachment of the crystal element 23 to the base member 21 as well as during long use thereof, without deviations in the electric properties of the respective holding mechanisms as in use of the supporting rod 16 of FIG. 2.

It will be noted that a tuning fork-type quartz crystal element vibrating within a frequency range from about 1 KHz to about 1 MHz ordinarily has such an acoustic impedance of about $1 \times 10^5$ to $2 \times 10^6 \mu$ bar/cm/sec that becomes higher as the frequencies increase. Thus the aforesaid particular adhesive agent 24 may consist of an electric insulating type having an acoustic impedance of about $1 \times 10^5$ to $1 \times 10^6 \mu$ bar/cm/sec such as those known by the trade name of ARALDITE, CEMEDINE-1500 or CEMEDINE-3000, or another electric conducting type having an acoustic impedance of about $1 \times 10^6$ to $1 \times 10^7 \mu$ bar/cm/sec such as gold-germanium alloy, silver paste or solder.

Where the crystal element 23 of FIG. 4B is intended for use with an electronic watch vibrating at 32.768 KHz, the paired arms 23a and 23b of the crystal element 23 are designed to have, as shown in FIG. 5, lengths $l_1$ and $l_2$ respectively of about 7 mm and square cross sections one side of which has a length of about 0.6 to 0.7 mm.

The common connecting section 23c of the paired crystal arms 23a and 23b is formed with a width W of about 1.8 mm. In this case, the base member 21 is comprised of a glass disk 21a about 2 to 4 mm in diameter and about 1 to 2 mm thick, and an electric conducting metal layer 21b coated on the peripheral wall of the glass disk 21a with a thickness of about 0.1 to 0.2 mm.

Thus, after fixing the crystal element 23 to the base member 21 as described above, an electric conducting metal cover 27 having a substantially U-shaped cross section is hermetically sealed, as shown by a dotted line in FIG. 5, on the base member 21.

Figure 6A:
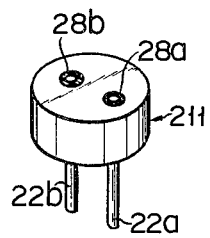
FIGS. 6A-6B to 11A-11B respectively are schematic perspective views according to the other embodiments of this invention.
Figure 6B:
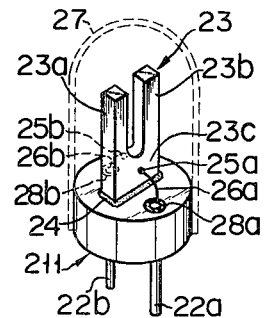

FIGS. 6A and 6B jointly are a schematic perspective view according to another embodiment of this invention.

This embodiment is substantially the same as that of FIGS. 4A and 4B, excepting that a base member 211 made of electric conducting material or comprising an electric insulation central glass disk similar to the glass disk 21a of FIGS. 4A and 4B and an electric conducting metal layer coated on all the surface of the central glass disk is replaced with the base member 21 of FIGS. 4A and 4B; and part of each of a pair of external electrodes 21a and 21b is embedded in the base member 211 through an electric insulating material 28a or 28b. Therefore, the parts of FIGS. 6A and 6B corresponding to those of FIGS. 4A and 4B are denoted by the same reference numerals and description thereof is omitted.

Figure 7A:
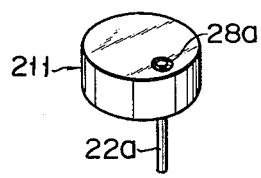
Figure 7B:
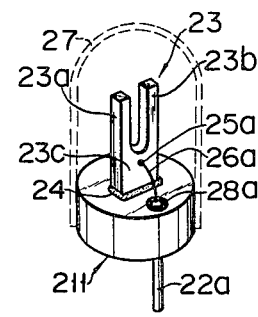

FIGS. 7A and 7B jointly are a schematic perspective view according to a further embodiment of this invention.

This embodiment is the same as that of FIGS. 6A and 6B, excepting that the base member 211 concurrently serves as one of the paired external electrodes 22b, and consequently less expensive than that of FIGS. 6A and 6B.

Figure 8A:
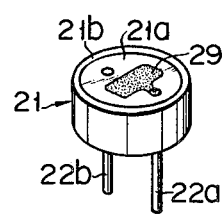
Figure 8B:
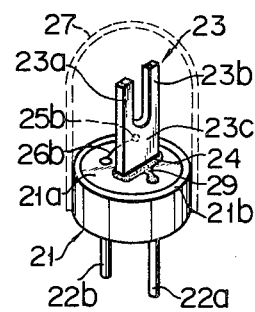

FIGS. 8A and 8B jointly are a schematic perspective view according to a still another embodiment of this invention.

This embodiment is substantially equivalent to that of FIGS. 4A and 4B, excepting that one of those paired nodal points which are formed by the prescribed opposite side walls of the common connecting crystal section 23c and on which the respective crystal electrodes are previously evaporated is replaced with the bottom plane of the common connecting section 23c of the paired crystal arms 23a and 23b; that an electric conducting metal film 29 is previously coated on the central glass disk 21a of the base member 21 so as to be electrically connected with one of the paired external electrodes 22a and 22b; and that the bottom of the common connecting section 23c of the crystal element 23 is fixed to the metal film 29 by the aforesaid electric conducting type of adhesive agent 24 having a different acoustic impedance from that of the crystal element 23.

The embodiment of FIGS. 8A and 8B has further advantages that one of the paired lead wires 26a and 26b shown in FIG. 4B can be omitted, and, as compared with the embodiment of FIGS. 4A and 4B, can reduce substantially by 50% the undesired effect that part of a mechanical vibration energy developed by the paired crystal arms 23a and 23b is transferred to the base member 21 through a pair of flexible lead wires as is in the case of FIG. 4 by the so-called wire resonance phenomena.

Figure 9A:
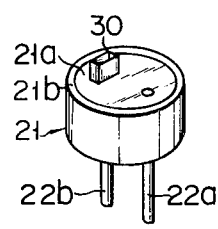
Figure 9B:
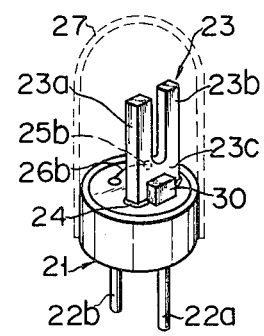

FIGS. 9A and 9B jointly are a schematic perspective view according to a still further embodiment of this invention.

This embodiment is substantially equivalent to that of FIGS. 8A and 8B, excepting that an electric conducting metal palte 30 provided on the exposed end of one of the paired external electrodes 22a and 22b is replaced with the electric conducting film 29 of FIGS. 8A and 8B, with substantially the same effect as the embodiment of FIGS. 8A and 8B.

Figure 10A:
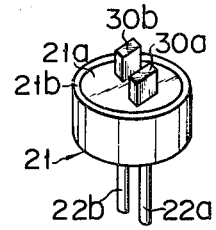
Figure 10B:
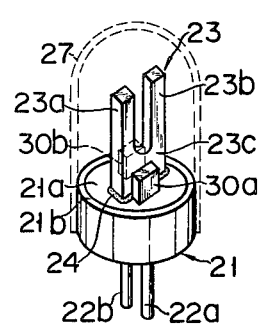

FIGS. 10A and 10B jointly are a schematic perspective view according to a different embodiment of this invention.

This embodiment is the same as that of FIGS. 9A and 9B, excepting that electric conducting metal plates 30a and 30b are provided on the corresponding exposed ends of the paired external electrodes 22a and 22b, not requiring a pair of flexible lead wires as in the case of FIGS. 4A and 4B.

In this case, the embodiment of FIGS. 9A and 9B may be designed either to bond one of the paired nodal point defined on the opposed side walls of the common connecting crystal section 23c to the metal plate 30 by the aforesaid electric conducting adhesive agent 24, or to press or solder one of the paired crystal electrodes to the metal plate 30, after fixing the bottom of the common connecting crystal section 23c to the base member 21 by the aforesaid particular adhesive agent 24.

The embodiment of FIGS. 10A and 10B may be designed in the same manner as that of FIGS. 9A and 9B, using both of the paired nodal points and of the metal plates 30a and 30b.

Figure 11A:
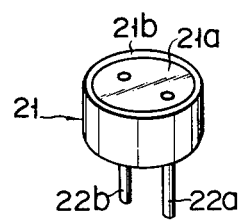
Figure 11B:
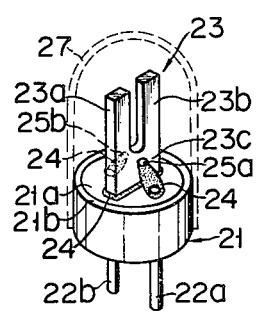

FIGS. 11A and 11B jointly are a schematic perspective view of a still different embodiment of this invention.

This embodiment is substantially the same as that of FIGS. 4A and 4B, excepting that the aforesaid electric conducting adhesive agents 24 are replaced with the paired flexible lead wires 22a and 22b of FIGS. 4A and 4B, with substantially the same effect as that of FIGS. 10A and 10B.

It should be pointed out that this invention is not limited to the embodiments as described above, but applicable to various modifications common in the technical concept.

For example, a mechanism and method for supporting a tuning fork-type quartz crystal element according to this invention is applicable not only as a crystal oscillator used with an electronic watch but also as various quartz crystal filter devices or electric crystal oscillators.

What is claimed is:

1. A tuning fork-type quartz crystal device, comprising:
    a quartz crystal element comprising a pair of arms having substantially the same dimensions and a common connecting section connecting the corresponding ends of said paired arms, said common connecting section having no uncoupling recesses, or the like, therein;
    holding means having a surface for receiving said quartz crystal element, means for substantially stationarily mounting said receiving surface and a pair of embedded external electrodes; and
    an adhesive interposed between said common connecting section of said quartz crystal element and said receiving surface of said holding means for firmly and substantially non-resiliently fixing in face-to-face relationship only the bottom surface of said common connecting section of said quartz crystal element to said holding means for supporting said crystal element, said adhesive agent being applied such that the side surfaces of said common connecting section are substantially free of restraining forces against vibration.

2. A device as claimed in claim 1 wherein said holding means comprises at least a portion of an outer housing of said quartz crystal element.

3. A device as claimed in claim 1 further comprising an outer housing for said quartz crystal element, said quartz crystal element being rigidly mounted within and to said outer housing.

4. A device as claimed in claim 1, the improvement wherein said adhesive agent rigidly fixes the bottom surface of said common connecting section of said quartz crystal element to said holding means in face-to-face relationship.

5. A device as claimed in claim 1, the improvement wherein said adhesive agent is one of ARAALDITE (trade name), CEMEDINE-1500 (trade name), CEMEDINE-3000 (trade name), or gold-germanium alloy silver paste or solder.

6. A device as claimed in claim 1, wherein said quartz crystal element has a pair of nodal points defined by two wall portions of said common connecting section of the crystal element,
the further improvement wherein said holding means comprises:
a base member, on one surface of which the bottom surface of said common connecting section of said crystal element is fixed by said adhesive agent,
a pair of external electrodes attached to said base member, and
a pair of electrically conductive means connecting the paired nodal points and the paired external electrodes.

7. A device as claimed in claim 6, the further improvement wherein at least said one surface of said base member is made of electric conducting material which concurrently serves as one of the paired external electrodes.

8. In a mechanism as claimed in claim 6, the further improvement wherein:
at least that surface of said base member on which said quartz crystal element is disposed is made of electrically insulating material and is coated with an electrically conductive film electrically connected to one of said paired external electrodes,
said adhesive agent is an electrically conductive adhesive agent, and
said bottom surface of said common connecting section of said crystal element is fixed to said electrically conductive film by said electrically conductive adhesive agent so as to serve as one of said paired electrically conductive means.

9. A device as claimed in claim 6, the further improvement wherein:
at least that surface of said base member on which said quartz crystal element is disposed is made of electrically insulating material and is provided with at least one electrically conductive metal plate electrically connected to the corresponding one of said paired external electrodes, and
said common connecting section of said quartz crystal element electrically contacts said at least one electrically conductive metal plate.

10. A device as claimed in claim 6, the further improvement wherein said adhesive agent is electrically conductive, and at least one of said paired electrically conductive means is comprised of said electrically conductive adhesive agent.

11. A device as claimed in claim 6 wherein said pair of electrically conductive means comprises a pair of lead wires.

12. A method for supporting a tuning fork-type quartz crystal element on a surface of a holding means which is adapted to be substantially stationarily mounted, comprising:
providing a quartz crystal element comprising a pair of arms having substantially the same dimensions and a common connecting section connecting the corresponding ends of said paired arms, said common connecting section having no uncoupling recesses, or the like, therein; and
firmly and substantially non-resiliently fixing, by means of an adhesive agent, only the bottom surface of said common connecting section of said quartz crystal element in face-to-face relationship to said surface of said holding means for supporting said quartz crystal element, said adhesive agent being applied such that the side surfaces of said common connecting section are substantially free of restraining forces against vibration.

13. A method according to claim 12, further comprising rigidly fixing the bottom surface of said common connecting section of said quartz crystal element in face-to-face relationship with said adhesive agent.

14. A method according to claim 12, further comprising fixing said bottom surface of said common connecting section of said quartz crystal element in face-to-face relationship to said holding means with one of the following adhesive agents: ARAALDITE (trade name), CEMEDINE-1500 (trade name), CEMEDINE-3000 (trade name), or gold-germanium alloy silver paste or solder.

15. A method according to claim 12 comprising fixedly and substantially non-resiliently connecting said holding means to an outer housing for said quartz crystal element.

* * * * *